US009385086B2

(12) United States Patent
Pan et al.

(10) Patent No.: US 9,385,086 B2
(45) Date of Patent: Jul. 5, 2016

(54) BI-LAYER HARD MASK FOR ROBUST METALLIZATION PROFILE

(71) Applicant: Taiwan Semiconductor Manufacturing Co., Ltd., Hsin-Chu (TW)

(72) Inventors: Shing-Chyang Pan, Jhudong Township (TW); Ching-Hua Hsieh, Hsinchu (TW); Hong-Hui Hsu, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/102,090

(22) Filed: Dec. 10, 2013

(65) Prior Publication Data

US 2015/0162282 A1    Jun. 11, 2015

(51) Int. Cl.
*H01L 23/48*    (2006.01)
*H01L 21/4763*    (2006.01)
*H01L 23/532*    (2006.01)
*H01L 21/768*    (2006.01)
*H01L 23/522*    (2006.01)

(52) U.S. Cl.
CPC .... *H01L 23/53295* (2013.01); *H01L 21/76808* (2013.01); *H01L 21/76813* (2013.01); *H01L 21/76834* (2013.01); *H01L 21/76873* (2013.01); *H01L 21/76879* (2013.01); *H01L 21/76804* (2013.01); *H01L 21/76807* (2013.01); *H01L 23/5226* (2013.01); *H01L 2924/0002* (2013.01)

(58) Field of Classification Search
CPC .................................................. H01L 21/76802
USPC ................... 257/773, 774; 438/638
See application file for complete search history.

(56) References Cited

U.S. PATENT DOCUMENTS

| 6,969,683 | B2 | 11/2005 | Hu et al. | |
|---|---|---|---|---|
| 7,282,436 | B2 | 10/2007 | Jiang et al. | |
| 7,507,660 | B2 | 3/2009 | Chen et al. | |
| 7,759,251 | B2 | 7/2010 | Geffken et al. | |
| 8,071,167 | B2 | 12/2011 | Kher et al. | |
| 2003/0013311 | A1 | 1/2003 | Chang et al. | |
| 2003/0100188 | A1* | 5/2003 | Huang | H01L 21/76807 438/694 |
| 2003/0186534 | A1* | 10/2003 | Nambu | H01L 21/31144 438/633 |
| 2004/0121585 | A1 | 6/2004 | Liu et al. | |
| 2005/0142847 | A1 | 6/2005 | Ryu | |
| 2006/0046502 | A1 | 3/2006 | Ngo et al. | |
| 2008/0184543 | A1 | 8/2008 | Sako et al. | |
| 2009/0246713 | A1* | 10/2009 | Zin | H01L 21/0206 430/323 |
| 2010/0327412 | A1* | 12/2010 | Lee | H01L 21/0337 257/618 |
| 2012/0205814 | A1 | 8/2012 | Wu et al. | |
| 2013/0095652 | A1* | 4/2013 | Harada | H01L 21/31144 438/622 |

OTHER PUBLICATIONS

Non Final Office Action Dated Feb. 11, 2015 U.S. Appl. No. 14/102,072.

(Continued)

*Primary Examiner* — David Vu
*Assistant Examiner* — Brandon Fox
(74) *Attorney, Agent, or Firm* — Eschweiler & Associates, LLC

(57) ABSTRACT

A robust metallization profile is formed by forming two or more layers of hard mask with different density. Multi-layer metal hard mask is helpful especially in small feature size process, for example, 50 nm and below. Lower layers have higher density. In such ways, enough process window is offered by lower layers and at the same time, round hard mask profile is offered by upper layers.

21 Claims, 6 Drawing Sheets

(56) References Cited

OTHER PUBLICATIONS

P. Josh Wolf, et al.; "Overview of Dual Damascene Cu/Low-k Interconnect"; ERC Retreat Stanford: New Chemistries & Tools for scCO2 Processing of Thin Films; International Sematech; Aug. 14, 2003; p. 1-21.

U.S. Appl. No. 14/102,072, filed Dec. 10, 2013.
Non Final Office Action Dated Aug. 10, 2015 U.S. Appl. No. 14/102,090.
Notice of Allowance Dated Dec. 30, 2015 U.S. Appl. No. 14/102,072.
English translation of Korean Office Action dated Jan. 14, 2016 for co-pending Korean Application No. 10-2014-0177840.

\* cited by examiner

BI-LAYER HARD MASK FOR ROBUST METALLIZATION PROFILE

BACKGROUND

As dimensions of semiconductor integrated circuit are scaled down, hard masks are utilized in processes. Hard masks have a high etch selectivity and help to get a high quality anisotropic etching to transfer patterns.

Some approaches are developed to improve performance of hard masks. Among those are techniques to remove hard masks with less damage introduced, techniques to clean residue after removal of hard masks, and tuning stress in the hard mask.

DETAILED DESCRIPTION

Figure 1:
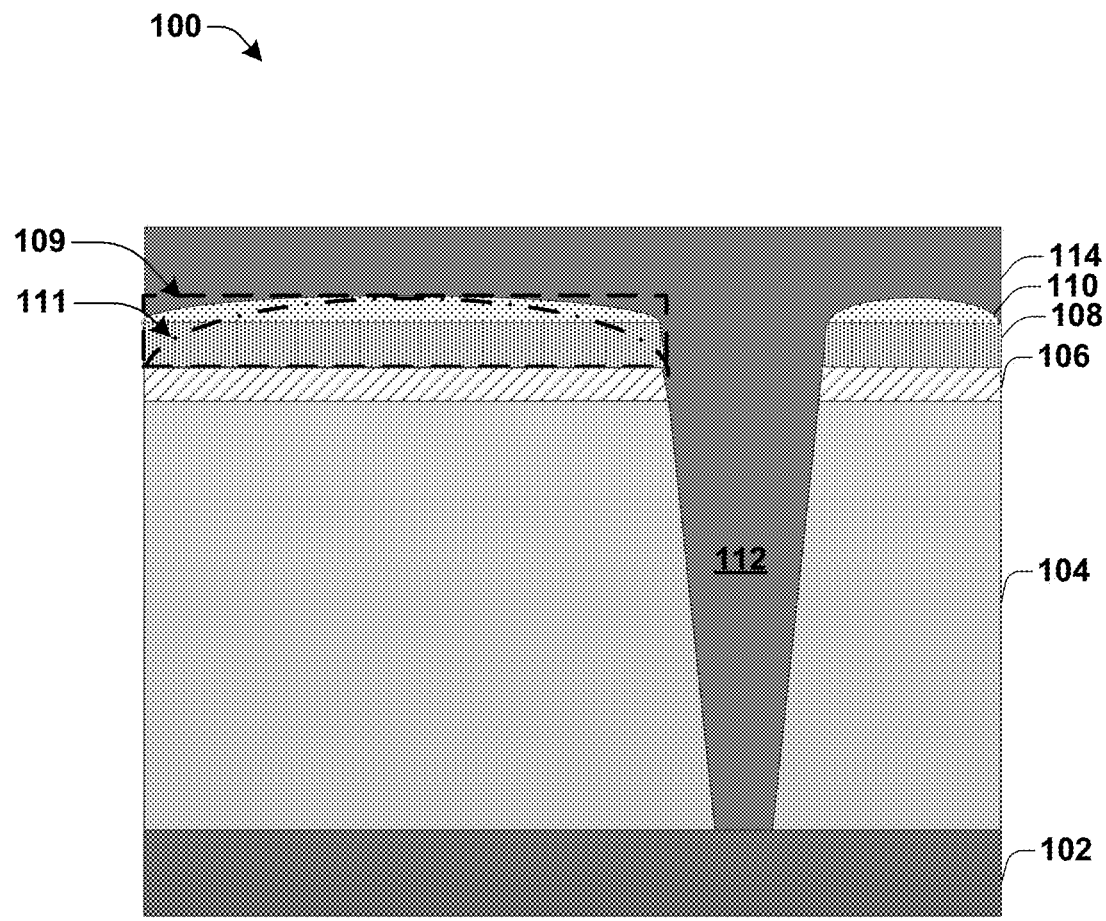
FIG. 1 illustrates a cross-sectional view of an interconnect structure in accordance with some embodiments.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It will be appreciated that the details of the Figures are not intended to limit the disclosure, but rather are non-limiting embodiments. For example, it may be evident, however, to one of ordinary skill in the art, that one or more aspects described herein may be practiced with a lesser degree of these specific details. In other instances, known structures and devices are shown in block diagram form to facilitate understanding.

Usage of a hard mask layer introduces high etch selectivity which helps to transfer patterns. As shown by a dashed line 109 in FIG. 1, a high density hard mask results in a relatively square shape after opening etching which has a negative effect on following conductive material filling performance. As shown by a chain line 111 in FIG. 1, a low density hard mask results in a relatively round shape after opening etching. However, a low density hard mask has such a fast etching rate that it degrades a process window as etching is performed. These issues become significant in small feature size processes, for example, 50 nm and below. With decreasing feature size, the requirement of a smooth and precise mask and pattern increases so that a conductive seed layer and a conductive layer above the conductive seed layer will form interconnects successfully. A hard mask with a relatively round outside curve and accurate pattern is realized by forming multiple hard mask layers with gradually different density. As a result, better gap-filling and accurate patterning are reached for formation of conductive interconnects.

FIG. 1 illustrates a cross-sectional view of an interconnect structure 100 in accordance with some embodiments. A porous low-k dielectric layer 104 is formed over a substrate 102 such as a silicon substrate. An anti-reflective coating (ARC) layer 106 is formed over the porous low-k dielectric layer 104. A first hard mask layer 108 with a first density is disposed over the ARC layer 106. A second hard mask layer 110 with a second density is disposed on the first hard mask layer 108. After patterning of the first and second hard masks 108 and 110, the ARC layer 106 and the dielectric layer 104, a conductive layer 114 is filled in an opening 112 to form a connection to the underlying substrate 102.

The first hard mask layer 108 or the second hard mask layer 110 can be a metal hard mask layer, for example, TiN. The second density of the second hard mask layer 110 is smaller than the first density of the first hard mask layer 108. For example, the first density is greater than approximately 4.8 g/cm$^3$ and the second density is less than approximately 4.8 g/cm$^3$. In some embodiments, a ratio of the second density to the first density is smaller than approximately 0.94. In some embodiments, a second thickness of the second hard mask layer 110 is larger than a first thickness of the first hard mask layer 108. The differing densities result in differing respective etch rates, wherein the lower the density, the greater the etch rate of the layer. After patterning and etching, the first hard mask layer 108 with a relatively low etch rate has a squared outside curve which maintains patterning accuracy while the second hard mask layer 110 with a relatively high etch rate has a rounded outside curve which helps subsequently deposited conductive material fill a contact or a via hole smoothly. A third hard mask layer with even a smaller density than the second hard mask layer can further be disposed on the second hard mask layer in some embodiments. Similarly, more hard mask layers with different densities can be disposed on in succession.

Figure 2:
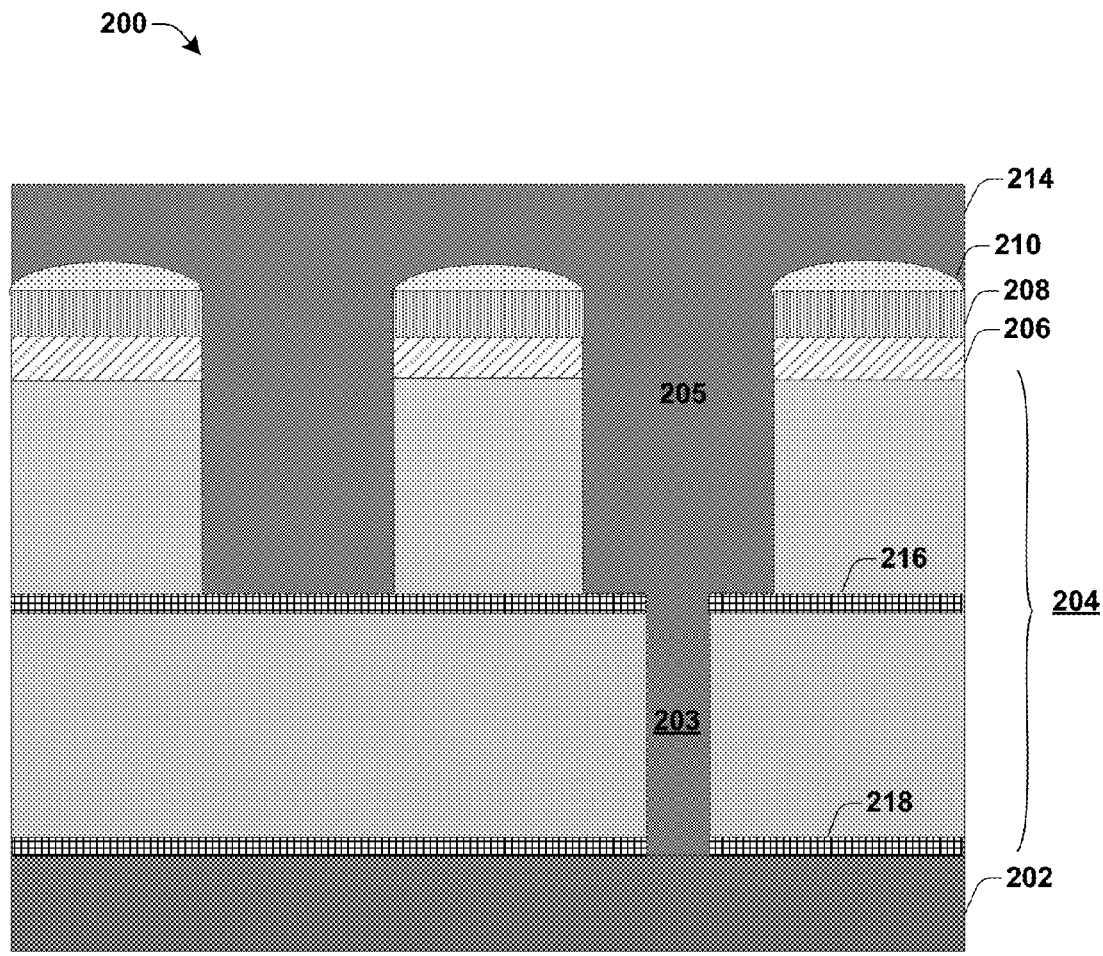
FIG. 2 illustrates a cross-sectional view of a dual damascene interconnect structure in accordance with some embodiments.

FIG. 2 illustrates a cross-sectional view of a dual damascene interconnect structure 200 in accordance with some embodiments. Similar to interconnect structure 100 of FIG. 1, a second hard mask layer 210 with a relatively smaller density is disposed on a first hard mask layer 208 having a relatively greater density. The first hard mask layer is thinner than the second hard mask layer. In some embodiments, thicknesses of the first hard mask layer and the second hard mask layer are in a range of about 300 Å to about 400 Å. The second hard mask layer 210 has a relatively rounded outside curve while the first hard mask layer 208 has a relatively squared outside curve. A barrier layer and a seed layer (not shown) are disposed between a porous low-k dielectric layer 204 and a conductive layer 214. The barrier layer and the seed layer can help forming of conductive layer and decreasing diffusion of the conductive material into the dielectric layer 204. A trench structure 205 and a via structure 203 under the trench are formed in the porous low-k dielectric layer 204. In some embodiments, a first etch stop layer 216 can be formed near a bottom surface of the trench 205 and a second etch stop layer 218 can be formed near a bottom surface of the via 203 in the porous low-k dielectric layer 204 to help forming of the trench and the via.

Figure 3:
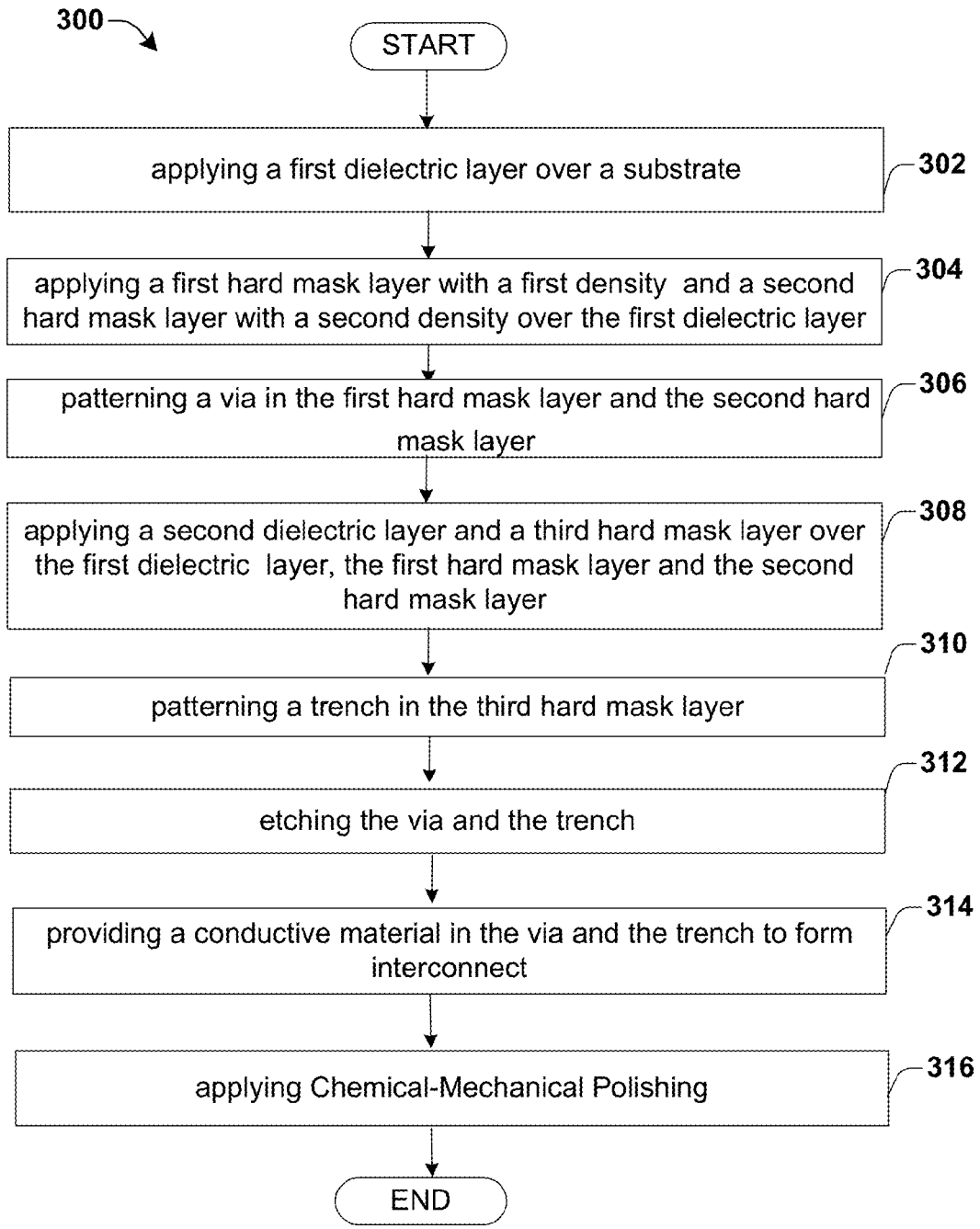
FIG. 3 illustrates a flow diagram of some embodiments of methods for forming a robust metallization profile.

FIG. 3 illustrates a flow diagram 300 of some embodiments of methods for forming a robust metallization profile. While disclosed methods (e.g., methods 300 of FIG. 3) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 302, a first dielectric layer is formed on a substrate. The dielectric layer can be a porous low-k material.

At 304, a first hard mask layer with a first density and a second hard mask layer with a second density are formed over the first dielectric layer. In some embodiments, the first density of the underlying first hard mask layer is greater than the underlying second density of the second hard mask layer.

At 306, a via structure is patterned in the first hard mask layer and the second hard mask layer.

At 308, a second dielectric layer and a third hard mask layer are formed in succession over the first dielectric layer, the patterned first hard mask layer and the patterned second hard mask layer.

At 310, a trench structure is patterned in the third hard mask layer.

At 312, the via structure and the trench structure are etched in the first dielectric layer and the second dielectric layer.

At 314, a conductive material, for example, copper is filled in the via and the trench to form the interconnect structure.

At 316, Chemical-Mechanical Polishing (CMP) is formed to planarize an upper region of the interconnect structure.

Notably, in some embodiments, the via structure and the trench structure are a Self-Align-Via (SAV) process dual damascene structure example of forming robust metallization profile. The via structure and the trench structure of the present disclosure can be formed by schemes for patterning and etching a via first then trench, a trench first then via, or a Self-Align-Via (SAV) process. Other proper opening structures can be patterned and etched in the first dielectric layer to form connection. The methods 300 can further comprise applying a fourth hard mask layer with a fourth density onto the first hard mask layer and the second hard mask layer that is smaller than the first density and the second density.

One example of FIG. 3's method is now described with regards to a series of cross-sectional views as shown in FIGS. 4a-4h. Although 4a-4h are described in relation to method 300, it will be appreciated that the structures disclosed in FIGS. 4a-4h are not limited to such a method, but instead may stand alone as a structure.

Figure 4A:
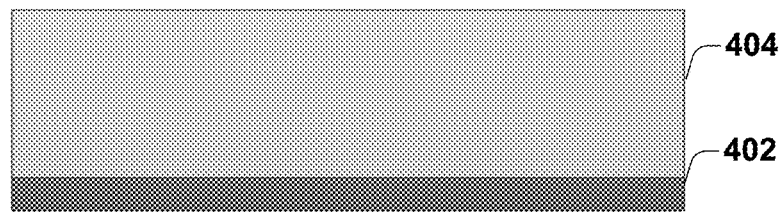
FIGS. 4a-4h illustrate cross-sectional views of some embodiments of a method of forming a robust metallization profile.

At FIG. 4a a first dielectric layer 404 is formed on a substrate 402. The first dielectric layer 404 can be porous low-k material layer and the substrate 402 may comprise any type of semiconductor material including a bulk silicon wafer, a binary compound substrate (e.g., GaAs wafer), or higher order compound substrates, with or without additional insulating or conducting layers formed thereover, among others.

Figure 4B:
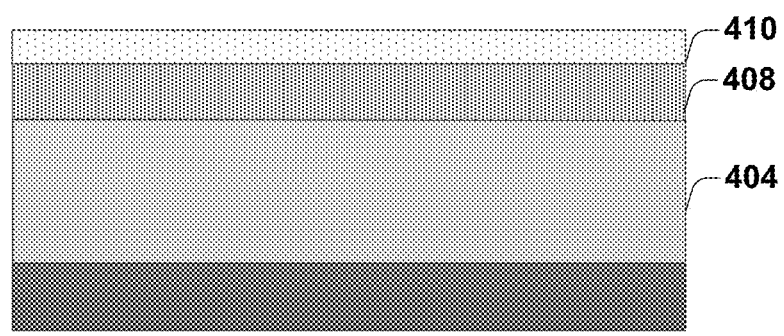

At FIG. 4b, a first hard mask layer 408 with a first density and a second hard mask layer 410 with a second density are formed in succession over the first dielectric layer 404. The first hard mask layer and the second hard mask layer can be TiN, Oxide-Nitride-Oxide (ONO), or Nitrided Silicon oxide (SiON). The first density is greater than the second density. In some embodiments, different densities can be realized with same compounds by using different powers and pressures during fabrication processes.

Figure 4C:
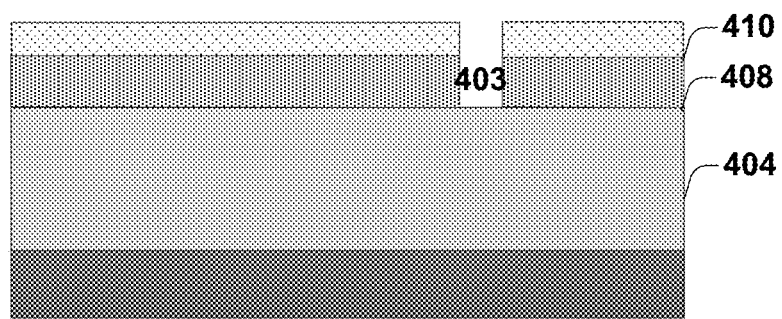

At FIG. 4c, a via structure 403 is patterned in the first hard mask layer 408 and the second hard mask layer 410.

Figure 4D:
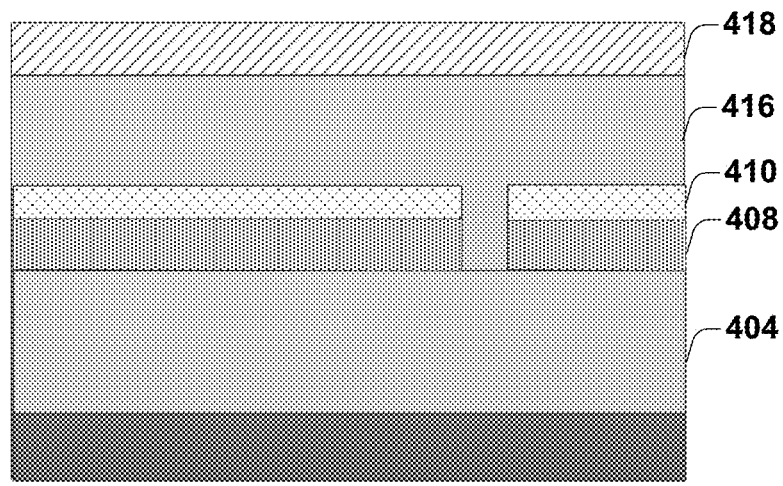

At FIG. 4d, a second dielectric layer 416 are formed over the first dielectric layer 404, the first hard mask layer 408 and the second hard mask layer 410. A third hard mask layer 418 is formed over the second dielectric layer 416 in succession. The third hard mask layer has a greater density, also a lower etching rate than the first hard mask layer and the second hard mask layer.

Figure 4E:
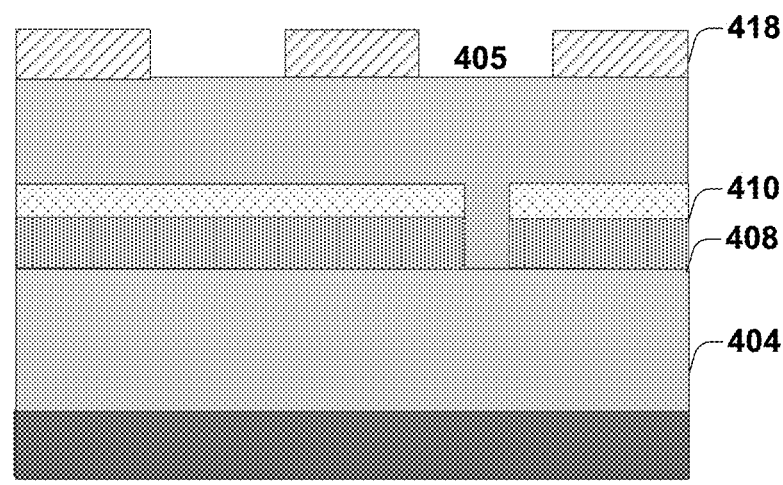

At FIG. 4e, a trench structure 405 is patterned in the third hard mask layer 418.

Figure 4F:
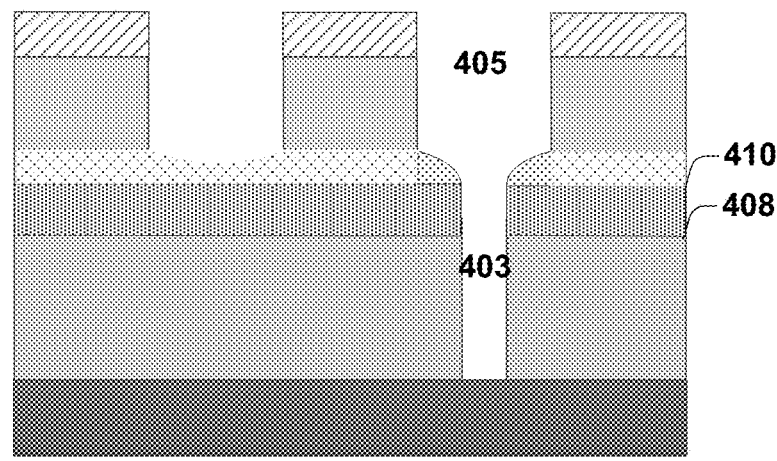

At FIG. 4f, the via structure 403 and the trench structure 405 are etched. In some embodiments, a dry etch with an anisotropic etching rate of approximately 1500 A/min is used for etching.

Figure 4G:
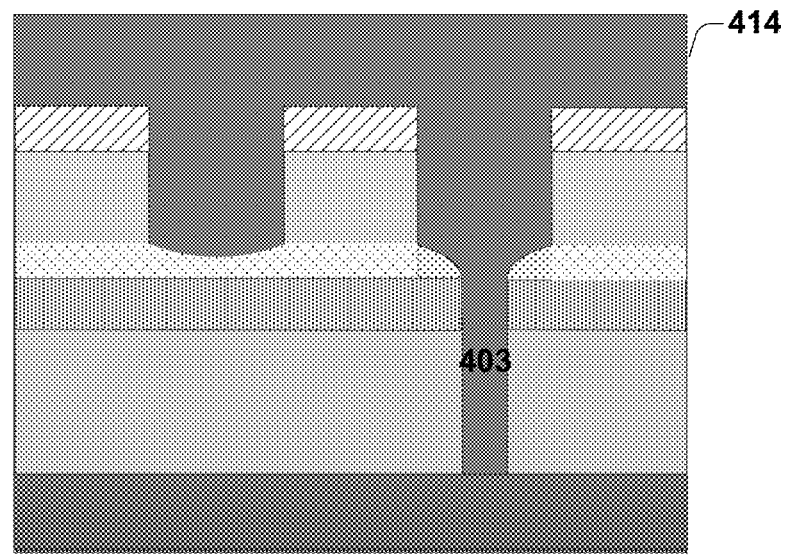

At FIG. 4g, a conductive material, for example, copper, is filled in the via and the trench to form the interconnect structure 414. The interconnect structure 414 can be formed by initially depositing a seed layer first and electroplating copper later.

Figure 4H:
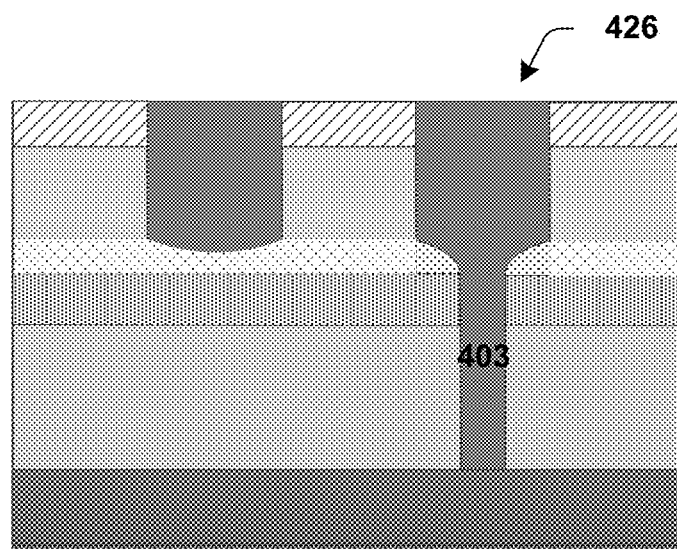

At FIG. 4h, Chemical-Mechanical Polishing (CMP) is formed to planarize an upper region 420 of the interconnect structure.

Thus, some embodiments relate to an integrated circuit structure. The integrated circuit structure comprises a silicon substrate, a porous low-k dielectric layer over the silicon substrate, a first hard mask layer with a greater density than a density of a second overlying hard mask layer. The integrated circuit structure further comprises an opening and a filled conductive layer therein to form connection.

Other embodiments relate to a dual damascene structure. The dual damascene structure comprises a silicon substrate, a porous low-k dielectric layer over the silicon substrate, an anti-reflective coating layer over the porous low-k dielectric layer and a first hard mask layer with a greater density than a density of a second overlying hard mask layer. The dual damascene structure further comprises a via structure and a trench structure in the porous low-k dielectric layer which are filled by a conductive layer.

Still another embodiment relates to a method for forming a robust metallization profile. In this method, a first dielectric layer is formed on a substrate. The dielectric layer can be a porous low-k material. Then a first hard mask layer with a first density and a second hard mask layer with a second density are formed in succession over the first dielectric layer. The first density is larger than the second density. An opening is patterned and etched through the first and second hard mask layers, and then through the dielectric layer. A conductive material is filled in the opening to form the interconnect structure.

It will be appreciated that while reference is made throughout this document to exemplary structures in discussing aspects of methodologies described herein (e.g., the structure presented in FIGS. 4a-4h, while discussing the methodology set forth in FIG. 3), that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the Figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. An integrated circuit (IC) structure comprising:
a substrate,
a dielectric layer over the substrate,
a first hard mask layer with a first density over the dielectric layer,
a second hard mask layer with a second density arranged on the first hard mask layer, and having a rounded upper surface, and
an opening extending through the first hard mask layer, the second hard mask layer and the dielectric layer, and
a conductive material filling in the opening,
wherein the second density of the second hard mask layer is less than the first density of the first hard mask layer.

2. The integrated circuit (IC) structure of claim 1 further comprising a third hard mask layer on the second hard mask layer with a third density less than the first density and the second density.

3. The integrated circuit (IC) structure of claim 1, wherein the first density is greater than approximately 4.8 g/cm³ and the second density is less than approximately 4.8 g/cm³.

4. The integrated circuit (IC) structure of claim 1, wherein a ratio of the second density to the first density is smaller than approximately 0.94.

5. The integrated circuit (IC) structure of claim 1, wherein a second thickness of the second hard mask layer is larger than a first thickness of the first hard mask layer.

6. The integrated circuit (IC) structure of claim 1, wherein the first hard mask layer or the second hard mask layer are TiN.

7. The integrated circuit (IC) structure of claim 1, wherein the first hard mask layer is in direct contact with the second hard mask layer.

8. A dual damascene structure, comprising
a substrate,
a dielectric layer over the substrate,
a via structure and a trench structure in the dielectric layer,
an anti-reflective coating (ARC) layer over the dielectric layer,
a first hard mask layer with a first density over the ARC layer,
a second hard mask layer on the first hard mask layer with a second density, and
a conductive layer filling the via and the trench structure,
wherein a second density of the second hard mask layer is less than the first density of the first hard mask layer.

9. The dual damascene structure of claim 8, wherein the first density is greater than approximately 4.8 g/cm³ and the second density is less than approximately 4.8 g/cm³ or a ratio of the second density to the first density is smaller than approximately 0.94.

10. The dual damascene structure of claim 8, wherein the first hard mask layer and the second hard mask layer comprise TiN, Oxide-Nitride-Oxide (ONO), or Nitrided Silicon oxide (SiON).

11. A method for forming a robust metallization profile, comprising:
applying a first dielectric layer over a substrate,
applying a first hard mask layer with a first density and a second hard mask layer with a second density in succession over the first dielectric layer,
patterning and etching an opening through the second hard mask layer, the first hard mask layer and the first dielectric layer, and
providing a conductive material in the opening to form an interconnect structure, wherein the first density of the first hard mask layer is larger than the second density of the second hard mask layer.

12. The method of claim 11, further comprising:
patterning a via structure in the first hard mask layer and the second hard mask layer, forming a second dielectric layer over the first dielectric layer, the first hard mask layer and the second hard mask layer and forming a third hard mask layer over the second dielectric layer in succession,
patterning a trench structure in the third hard mask layer,
etching the via structure and the trench structure, and
providing the conductive material in the via structure and the trench structure to form the interconnect structure.

13. The method of claim 12, wherein a dry etching is applied with an anisotropic etching rate from approximately 700 A/min to approximately 2000 A/min to etch the via structure and the trench structure.

14. The method of claim 11, wherein the first dielectric layer is a porous low-k material.

15. The method of claim 11, further comprising applying an anti-reflective coating (ARC) layer over the first dielectric layer prior to applying the first hard mask layer.

16. The method of claim 11, further comprising applying a fourth hard mask layer onto the second hard mask layer with a fourth density smaller than the first density and the second density.

17. The method of claim 11, further comprising schemes for patterning and etching a via first then trench, a trench first then via, or a Self-Align-Via (SAV) process.

18. The method of claim 12, further comprising applying Chemical-Mechanical Polishing (CMP).

19. The method of claim 12, wherein the conductive material is copper.

20. The method of claim 12, wherein the interconnect structure is formed by depositing a seed layer and electroplating metal.

21. An integrated circuit (IC) structure comprising:
a substrate;
a dielectric layer over the substrate;
a first hard mask layer with a first density over the dielectric layer;
a second hard mask layer with a second density arranged on the first hard mask layer;
an opening extending through the first hard mask layer, the second hard mask layer and the dielectric layer; and
a conductive material filling in the opening;
wherein the second density of the second hard mask layer is less than the first density of the first hard mask layer, and wherein the first hard mask layer or the second hard mask layer are TiN.

* * * * *